United States Patent [19]
Liu

[11] Patent Number: 6,039,854
[45] Date of Patent: Mar. 21, 2000

[54] SUBSTRATE CLAMP DESIGN FOR MINIMIZING SUBSTRATE TO CLAMP STICKING DURING THERMAL PROCESSING OF THERMALLY FLOWABLE LAYERS

[75] Inventor: David Liu, Taipei, Taiwan

[73] Assignee: Vanguad International Semiconductor Corporation, Hsin-Chu, Taiwan

[21] Appl. No.: 09/157,514

[22] Filed: Sep. 21, 1998

Related U.S. Application Data

[62] Division of application No. 08/782,707, Jan. 13, 1997, Pat. No. 5,843,520.

[51] Int. Cl.$^7$ .................................................. C23C 14/50
[52] U.S. Cl. .............................. 204/298.11; 204/298.15; 156/345; 118/721
[58] Field of Search ..................................... 118/720, 721, 118/728, 500, 503; 204/298.15, 298.11; 156/345

[56] References Cited

U.S. PATENT DOCUMENTS

| | | | |
|---|---|---|---|
| 4,486,289 | 12/1984 | Parsons et al. | 204/298 |
| 4,522,697 | 6/1985 | Dimock et al. | 204/298 |
| 4,523,985 | 6/1985 | Dimock | 204/298 |
| 4,836,905 | 6/1989 | Davis et al. | 204/298 |
| 4,978,412 | 12/1990 | Aoki et al. | 204/298.15 |
| 5,534,110 | 7/1996 | Lenz et al. | 156/345 |
| 5,632,873 | 5/1997 | Stevens et al. | 204/298.15 |
| 5,810,931 | 9/1998 | Stevens et al. | 204/298.11 |

OTHER PUBLICATIONS

S. Wolf et al. "Silicon Processing For The VLSI Era, vol. 1" Lattice Press, Sunset Beach, CA, 1986, p. 359–363.
Ono et al. "Development of a Planarized Al–Si Contact Filling Technology", 1990 VMIC Conf. Proceedings (Jun. 12–13, 1990) p. 76–82.
Chen et al. "Planarized Aluminum Metallization for Sub–O–Sum CMOS Technology" IEEE IEDM '90, p. 90–51 to 90–53.
Park et al. "Al–PLAPH (Aluminum Planarization by Post–Heating) Process for Planarized Double Metal CMOS Applications" 1991 VMIC Conference Proceedings (Jun. 11–12, 1991) p. 326–28.

*Primary Examiner*—Rodney McDonald
*Attorney, Agent, or Firm*—George O. Saile; Stephen B. Ackerman; Alek P. Szecsy

[57] ABSTRACT

A clamp for fixturing a substrate when forming and thermally processing upon the substrate a thermally flowable layer. The clamp comprises a backing member having a top member connected through a first mechanical means to the backing member. The backing member and the top member are sized such that a substrate may be clamped between the backing member and the top member. A portion of the top member overlaps the substrate and leaves exposed a first portion of the substrate when the substrate is clamped between the backing member and the top member. The clamp also comprises a shroud connected through a second mechanical means to the backing member, where a portion of the shroud overlaps the top member. The shroud leaves exposed a second portion of the substrate which is smaller than and contained within the first portion of the substrate. The shroud is removable from the backing member while the substrate remains clamped between the backing member and the top member.

10 Claims, 3 Drawing Sheets

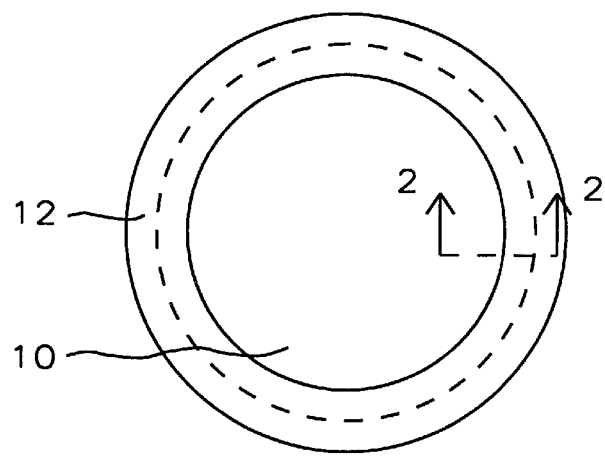
FIG. 1 – Prior Art
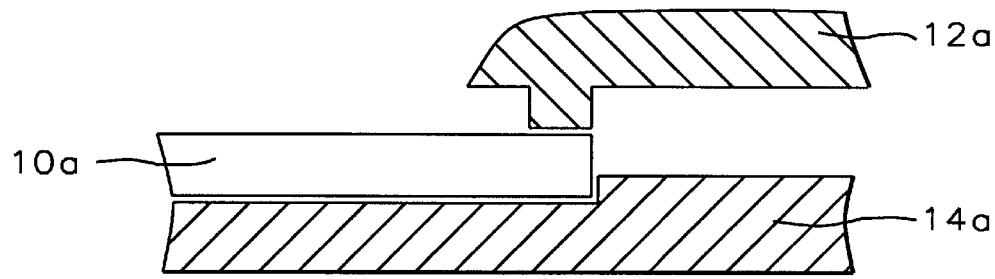
FIG. 2 – Prior Art
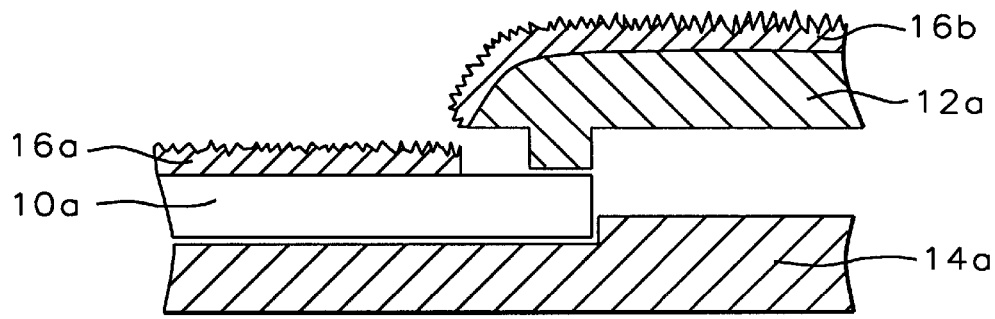
FIG. 3 – Prior Art

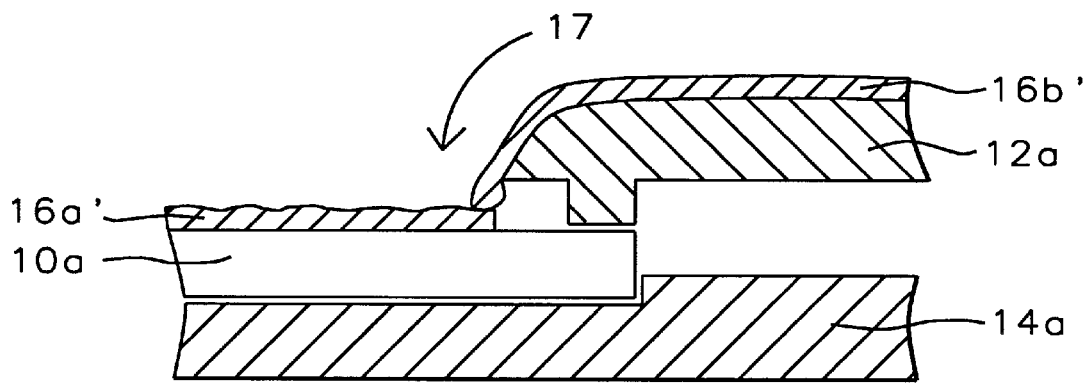
FIG. 4 — Prior Art
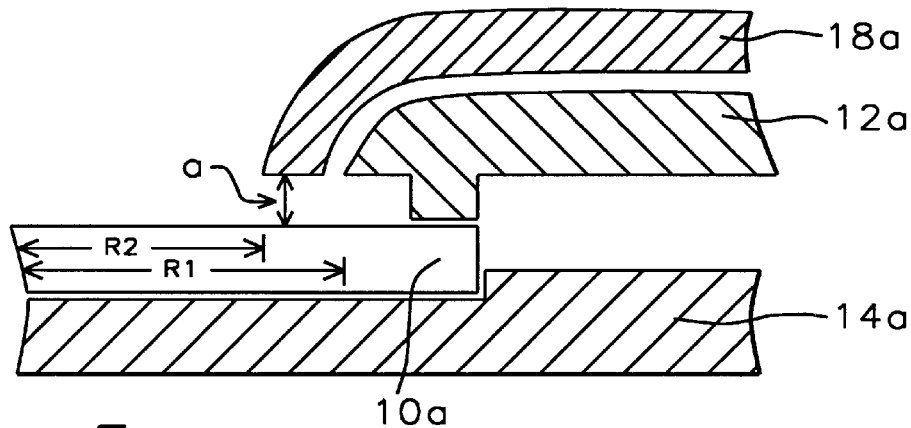
FIG. 5
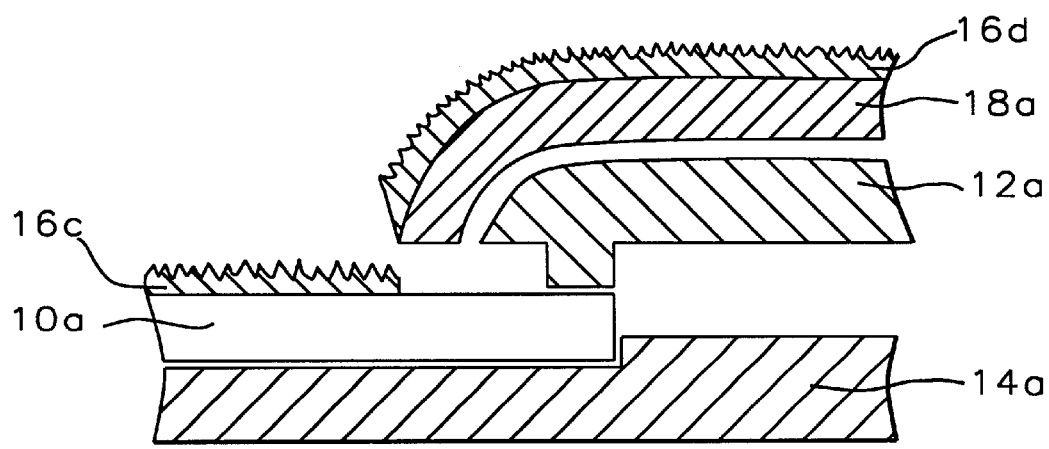
FIG. 6

SUBSTRATE CLAMP DESIGN FOR MINIMIZING SUBSTRATE TO CLAMP STICKING DURING THERMAL PROCESSING OF THERMALLY FLOWABLE LAYERS

This is a division of patent application Ser. No. 08/782,707, filing date Jan. 13, 1997, now U.S. Pat. No. 5,843,520 Substrate Clamp Design For Minimizing Substrate To Clamp Sticking During Thermal Processing Of Thermally Flowable Layers, assigned to the same assignee as the present invention.

BACKGROUND OF THE INVENTION

1. Field of the Invention

The present invention relates generally to forming thermally flowable layers upon substrates. More particularly, the present invention relates to a substrate clamp design for minimizing sticking of a substrate to the substrate clamp when forming and thermally processing a thermally flowable layer upon a substrate clamped within the substrate clamp.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

Patterned conductor layers for use within integrated circuits are typically formed through patterning through etching methods as are conventional in the art of blanket conductor layers formed upon semiconductor substrates. Most commonly, blanket conductor layers are formed upon semiconductor substrates from low melting temperature metal containing conductor layers formed of low melting temperature conductor metals such as but not limited to aluminum, aluminum alloys, aluminum-silicon alloys, aluminum-copper alloys and aluminum-silicon-copper alloys. Blanket low melting temperature metal containing conductor layers, such as blanket aluminum containing conductor layers, may be formed upon semiconductor substrates through several methods as are conventional in the art, including but not limited to thermally assisted evaporation methods, electron beam assisted evaporation methods and physical vapor deposition (PVD) sputtering methods.

In many of the several methods for forming a blanket low melting temperature metal containing conductor layer, such as a blanket aluminum containing conductor layer, upon a substrate, such as a semiconductor substrate, it is common in the art to employ a substrate clamp which among other functions serves as a fixture for properly positioning the substrate within a blanket low melting temperature metal containing conductor layer deposition tool, such as a blanket aluminum containing conductor layer deposition tool, when forming the blanket low melting temperature metal containing conductor layer, such as the blanket aluminum containing conductor layer, upon the substrate. A schematic plan-view diagram of a substrate clamped within a typical substrate clamp is shown in FIG. 1. Shown in FIG. 1 is a substrate 10 positioned beneath a top member 12 of a substrate clamp. Although FIG. 1 illustrates the top member 12 of the substrate clamp as a circular ring, a substrate clamp having a top member formed with an alternate geometric configuration to accommodate a substrate similarly formed with an alternate geometric configuration is not precluded for use within blanket low melting temperature metal containing conductor layer deposition tooling.

In accord with the cross-section 2—2 as illustrated in FIG. 1, FIG. 2 shows a schematic cross-sectional diagram of a portion of the substrate 10 clamped within the substrate clamp as illustrated in FIG. 1. As shown in FIG. 2, the substrate 10a is positioned within the substrate clamp between the top member 12a of the substrate clamp and a backing member 14a of the substrate clamp. The top member 12a and the backing member 14a are connected through a mechanical means (not shown) otherwise conventional in the art of substrate clamp design and fabrication. Although FIG. 2 illustrates the backing member 14a as a backing plate, a substrate clamp having a backing member formed with an alternate geometric configuration is also not precluded for use within blanket low melting temperature metal containing conductor layer deposition tooling.

While the use of substrate clamps as a means for fixturing substrates within blanket low melting temperature metal containing conductor layer deposition tooling, such as blanket aluminum containing conductor layer deposition tooling, has become quite common in the art of blanket low melting temperature metal containing conductor layer deposition, the use of substrate clamps for fixturing substrates within blanket low melting temperature metal containing conductor layer deposition tooling is not entirely without problems. In particular, it is known in the art that when substrate clamps, such as the substrate clamp whose schematic cross-sectional diagram is illustrated in FIG. 2, are employed as fixtures within blanket low melting temperature metal containing conductor layer deposition tooling and methods, such as blanket aluminum containing conductor layer deposition tooling and methods, there is observed a sticking of a substrate to the top member of the substrate clamp when a blanket low melting temperature metal containing conductor layer, such as a blanket aluminum containing conductor layer, formed upon the substrate clamped within the substrate clamp is thermally processed at elevated temperature (typically in excess of about 350 degrees centigrade for aluminum containing conductor layers, at which temperature aluminum containing conductor alloys typically flow) to form a thermally processed blanket low melting temperature metal containing conductor layer, such as a thermally processed blanket aluminum containing conductor layer. Such sticking of the substrate to the top member of the substrate clamp is undesirable since it is often difficult to remove such a substrate when stuck to the top member of the substrate clamp without damaging either the blanket thermally processed low melting temperature metal containing conductor layer or the substrate. The physical mechanism through which such sticking occurs is illustrated by reference to the schematic cross-sectional diagrams of FIG. 3 and FIG. 4.

Shown in FIG. 3 is a schematic cross-sectional diagram otherwise equivalent to the schematic cross-sectional diagram of the substrate 10a clamped between the top member 12a and the backing member 14a of the substrate clamp as illustrated in FIG. 2, but where there is formed upon the substrate 10a a blanket low melting temperature metal containing conductor layer 16a and where there is also formed upon the top member 12a of the substrate clamp a low melting temperature metal containing conductor layer residue 16b. The blanket low melting temperature metal containing conductor layer 16a and the low melting temperature metal containing conductor layer residue 16b are typically formed simultaneously within most blanket low melting temperature metal containing conductor layer deposition tools and methods since most blanket low melting temperature metal containing conductor layer deposition tools and methods, such as blanket aluminum containing conductor layer deposition tools and methods, provide line-of-sight deposition characteristics. For the same reason, the blanket low melting temperature metal containing conductor layer 16a is not formed upon the portion of the substrate 10a shaded by the top member 12a of the substrate clamp.

Shown in FIG. 4 is the results of further processing of the blanket low melting temperature metal containing conductor layer 16a formed upon the substrate 10a as illustrated in FIG. 3. Shown in FIG. 4 is the results of thermal processing of the blanket low melting temperature metal containing conductor layer 16a formed upon the substrate 10a as illustrated in FIG. 3. As is seen within FIG. 4, the low melting temperature metal containing conductor layer residue 16b, when thermally processed simultaneously with the blanket low melting temperature metal containing conductor layer 16a, flows to form the thermally processed low melting temperature metal containing conductor layer residue 16b' which bridges to the thermally processed blanket low melting temperature metal containing conductor layer 16a' by virtue of flow of the thermally processed low melting temperature metal containing conductor layer residue 16b', as indicated by the arrow 17 in FIG. 4.

It is thus towards the goal of eliminating substrate to top member of substrate clamp sticking through a physical mechanism involving flow of a thermally processed low melting temperature metal containing conductor layer residue, such as the thermally processed low melting temperature metal containing conductor layer residue 16b' as illustrated in FIG. 4, that the present invention is specifically directed.

Various aspects of blanket integrated circuit layer deposition tooling and methods, such as blanket low melting temperature metal containing conductor layer deposition tooling and methods, and in particular blanket aluminum containing conductor layer deposition tooling and methods, have been disclosed in the art. For example, Wolf et al., in Silicon Processing for the VLSI Era, Vol. 1—Process Technology, Lattice Press (Sunset Beach, Calif.: 1986), pp. 359–63 disclose several details of the design and construction of sputter systems employed in depositing various metal layers within integrated circuits. In addition, Parsons et al., in U.S. Pat. No. 4,486,289 disclose for depositing integrated circuit layers within integrated circuits a compact planar magnetron sputtering apparatus with improved magnetic coupling to the cathode of the planar magnetron sputtering apparatus. Further, Dimock et al, in U.S. Pat. No. 4,522,697 and Dimock, in U.S. Pat. No. 4,523,985 disclose a method and apparatus for indexing substrate wafers to be transferred from a conventional substrate wafer carrier to a substrate wafer processing apparatus wherein integrated circuit layers may be formed upon the substrate wafers. Yet further, Davis et al., in U.S. Pat. No. 4,836,905 discloses a substrate wafer processing method and apparatus where a substrate wafer when in a face down position within a reactor chamber is exposed to a first processing step, preferably a plasma cleaning process step, while the substrate wafer when subsequently moved to a vertical position within the reactor chamber is then exposed to a second processing step, preferably a sputter deposition process step. Through the method and apparatus there is avoided particulate contamination accumulation upon the substrate wafer.

Finally: (1) Ono et al., in "Development of a Planarized Al—Si Contact Filling Technology," 1990 VMIC Conference Proceedings (Jun. 12–13, 1990), pp. 76–82; (2) Chen et al., in "Planarized Aluminum Metallization for Sub-0.5 $\mu$m CMOS Technology," IEEE IEDM 90, pp. 90–51 to 90–53; and (3) Park et al., in "Al-PLAPH (ALuminum PLAnarization by Post Heating) Process for Planarized Double Metal CMOS Applications," 1991 VMIC Conference Proceedings (Jun. 11–12, 1991), pp. 326–28, disclose various methods for forming within integrated circuits blanket aluminum containing conductor layers exhibiting sub-micron contacts to substrates or sub-micron via filling properties.

Desirable in the art are methods, materials and designs through which substrate clamps employed as fixtures when forming and thermally processing blanket low melting temperature metal containing conductor layers upon substrates clamped within those substrate clamps may be fabricated and employed in a fashion such that the substrates do not stick to the substrate clamps. Particularly desirable are methods, materials and designs through which substrate clamps employed as fixtures when forming and thermally processing blanket aluminum containing conductor layers upon semiconductor substrates clamped within those substrate clamps may be fabricated and employed in a fashion such that the semiconductor substrates do not stick to substrate clamps. It is towards the foregoing goals that the present invention is generally directed.

SUMMARY OF THE INVENTION

A first object of the present invention is to provide a substrate clamp for use in fixturing a substrate when forming and thermally processing upon the substrate a blanket low melting temperature metal containing conductor layer.

A second object of the present invention is to provide a substrate clamp in accord with the first object of the present invention, where the substrate does not stick to the substrate clamp when forming and thermally processing the blanket low melting temperature metal containing conductor layer upon the substrate clamped within the substrate clamp.

A third object of the present invention is to provide a substrate clamp in accord with the first object of the present invention and the second object of the present invention, where the blanket low melting temperature metal containing conductor layer is formed from an aluminum containing conductor material.

A fourth object of the present invention is to provide a substrate clamp in accord with the first object of the present invention, the second object of the present invention or the third object of the present invention, which substrate clamp is readily manufacturable.

In accord with the foregoing objects, there is provided by the present invention a substrate clamp for use in fixturing a substrate when forming and thermally processing upon the substrate a blanket low melting temperature metal containing conductor layer. The substrate clamp comprises a backing member and a top member connected through a first mechanical means to the backing member. The backing member and the top member are sized such that a substrate may be clamped between the backing member and the top member. A portion of the top member overlaps the substrate and leaves exposed a first portion of the substrate when the substrate is clamped between the backing member and the top member. The substrate clamp also comprises a shroud connected through a second mechanical means to the backing member, where a portion of the shroud overlaps the top member. The shroud leaves exposed a second portion of the substrate which is smaller than and contained within the first portion of the substrate. The shroud is removable from the backing member while the substrate remains clamped between the backing member and the top member.

The substrate clamp of the present invention also contemplates a method through which the substrate clamp of the present invention may be employed in forming and thermally processing upon a substrate clamped within the substrate clamp a blanket low melting temperature metal containing conductor layer. In addition, the substrate clamp of the present invention also contemplates that the substrate clamp of the present invention may also be employed in forming and thermally processing upon substrates blanket thermally flowable layers other than blanket low melting temperature metal containing conductor layers.

The present invention provides a substrate clamp for use as a fixture when forming and thermally processing a blanket low melting temperature metal containing conductor layer upon a substrate clamped within the substrate clamp, where the substrate does not stick to the substrate clamp when forming and thermally processing the blanket low melting temperature metal containing conductor layer upon the substrate clamped within the substrate clamp. The substrate clamp of the present invention achieves this goal through providing a substrate clamp having a shroud connected through a second mechanical means to a backing member of the substrate clamp, where the shroud overlaps a top member of the substrate clamp which is similarly connected to the backing member through a first mechanical means. The shroud leaves exposed a second region of the substrate smaller than and contained within a first region of the substrate exposed through the top member of the substrate clamp which overlaps the substrate, when the substrate is clamped between the top member and the backing member of the substrate clamp. The shroud is removable from the backing member while the substrate remains clamped between the top member and the backing member. Thus, when: (1) the shroud is employed when forming a blanket low melting temperature meal containing conductor layer upon the second region of the substrate while simultaneously forming a low melting temperature metal containing conductor layer residue upon the shroud; and (2) the shroud is subsequently removed from the backing member prior to thermally processing the blanket low melting temperature metal containing conductor layer formed upon the second region of the substrate, there may be formed and thermally processed a blanket low melting temperature metal containing conductor layer upon the substrate without sticking of the substrate to the substrate clamp.

The substrate clamp of the present invention may be employed where the blanket low melting temperature metal containing conductor layer is formed from an aluminum containing conductor material. The substrate clamp of the present invention does not discriminate with respect to the nature of the blanket low melting temperature metal containing conductor layer, or other thermally flowable layer, desired to be formed upon a substrate clamped within the substrate clamp. Thus, the substrate clamp of the present invention may be employed to avoid sticking of a substrate to the substrate clamp when there is formed upon the substrate clamped within the substrate clamp a blanket low melting temperature metal containing conductor layer formed of an aluminum containing conductor material, as well as other thermally flowable materials.

The substrate clamp of the present invention is readily manufacturable. As is disclosed within the Description of the Preferred Embodiment, the substrate clamp of the present invention may be formed through modifying a substrate clamp otherwise conventional in the art of substrate clamp design and fabrication. The modification may be undertaken through machining and fabrication methods which are conventional in the art. Thus, the substrate clamp of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 shows a schematic plan-view diagram of a substrate clamped within a substrate clamp conventional in the art of substrate clamp design and fabrication.

FIG. 2 shows a schematic cross-sectional diagram illustrating a portion of the substrate clamped within a portion of the substrate clamp as illustrated in FIG. 1.

FIG. 3 and FIG. 4 show a pair of schematic cross-sectional diagrams illustrating the results of progressive stages in forming and thermally processing a blanket low melting temperature metal containing conductor layer upon the substrate clamped within the substrate clamp whose schematic cross-sectional diagram is illustrated in FIG. 2.

FIG. 5 to FIG. 8 show a series of schematic cross-sectional diagrams illustrating the results of progressive stages in forming and thermally processing a blanket low melting temperature metal containing conductor layer upon a substrate clamped within a substrate clamp formed in accord with the preferred embodiment of the present invention.

DESCRIPTION OF THE PREFERRED EMBODIMENT

Figure 7:
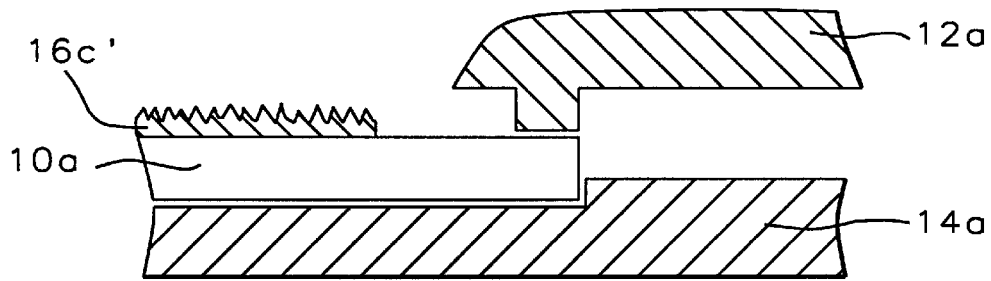

The present invention provides a substrate clamp, and a method for employing the substrate clamp when forming and thermally processing a blanket low melting temperature metal containing conductor layer upon a substrate clamped within the substrate clamp, where the substrate does not stick to the substrate clamp when the blanket low melting temperature metal containing conductor layer is formed and thermally processed upon the substrate clamped within the substrate clamp. The substrate clamp of the present invention achieves this goal through providing a shroud over a top member of the substrate clamp of the present invention, where the shroud leaves exposed a second portion of the substrate clamped between the top member and a backing member of the substrate clamp. The second portion of the substrate is smaller than and centered within a first portion of the substrate which is exposed by the top member of the substrate clamp when the substrate is clamped between the top member and the backing member of the substrate clamp. When the shroud is employed when forming a blanket low melting temperature metal containing conductor layer upon the second region of the substrate and a low melting temperature metal containing conductor layer residue upon the shroud, and the shroud is subsequently removed from the substrate clamp prior to thermally processing the blanket low melting temperature metal containing conductor layer upon the second region of the substrate, there may be formed and thermally processed a blanket low melting temperature metal containing conductor layer upon the substrate without sticking of the substrate to the substrate clamp.

Although the preferred embodiment of the substrate clamp of the present invention employs the substrate clamp of the present invention when forming and thermally processing a blanket aluminum containing conductor layer upon a semiconductor integrated circuit substrate clamped within the substrate clamp, the substrate clamp of the present invention may be employed when forming a blanket aluminum containing conductor layer upon a substrate other than a semiconductor integrated circuit substrate. Such other substrates include but are not limited to semiconductor substrates employed in forming solar cells, ceramic substrates employed in multilayer ceramic (MLC) packaging of integrated circuits, glass substrates employed within thin film transistors/liquid crystal displays, gallium arsenide substrates, silicon on insulator (SOI) substrates and silicon on sapphire (SOS) substrates. Additional descriptions of silicon on insulator (SOI) substrates and silicon on sapphire (SOS) substrates are provided by S. M. Sze in VLSI Technology, 2nd Edition, McGraw-Hill (New York: 1988), at pp. 85–89.

In addition, the substrate clamp of the present invention may be employed when forming and thermally processing a blanket low melting temperature metal containing conductor layer upon a substrate clamped within the substrate clamp, where the blanket low melting temperature metal containing conductor layer is formed from a low melting temperature metal containing conductor other than an aluminum containing conductor. Within the context of the present invention, the blanket low melting temperature metal containing conductor layer is preferably formed of a low melting temperature metal containing conductor having a melting temperature less than about 800 degrees centigrade. Thus, in addition to the preferred blanket aluminum containing conductor layers, including but not limited to aluminum, aluminum alloys, aluminum-silicon alloys, aluminum-copper alloys and aluminum-silicon-copper alloys, whose formation and thermal processing upon substrates is facilitated when those substrates are clamped within the substrate clamp of the present invention, other blanket low melting temperature metal containing conductor layers may be formed upon substrates clamped within the substrate clamp of the present invention. Such other blanket low melting temperature metal containing conductor layers may be formed of other low melting temperature metal containing conductors selected from the group of low melting temperature metal containing conductors consisting of lead, lead alloys, tin, tin alloys, antimony, antimony alloys, indium and indium alloys.

Finally, the substrate clamp of the present invention may also be employed when forming upon a substrate clamped within the substrate clamp a thermally flowable layer other than a blanket low melting temperature metal containing conductor layer. The thermally flowable layer may be formed of thermally flowable materials including but not limited to organic polymer materials, inorganic polymer materials, hybrid polymer materials and glasses which may be formed and thermally annealed upon substrates through methods including but not limited to thermally assisted evaporation methods, chemical vapor deposition (CVD) methods, physical vapor deposition (PVD) sputtering methods and in-situ vapor phase polymerization methods, typically at temperatures no greater than the temperatures employed in forming or thermally annealing blanket low melting temperature metal containing conductor layers upon substrates.

Referring now to FIG. 5 to FIG. 8 there is shown a series of schematic cross-sectional diagrams illustrating the results of progressive stages in forming and thermally processing upon a substrate clamped within a substrate clamp, the substrate clamp formed in accord with the preferred embodiment of the present invention, a blanket low melting temperature metal containing conductor layer. Shown in FIG. 5 is a schematic cross-sectional diagram of the substrate clamped within the substrate clamp at an early stage in forming and thermally processing the blanket low melting temperature metal containing conductor layer upon the substrate clamped within the substrate clamp.

Shown in FIG. 5 is a substrate clamp otherwise equivalent to the conventional substrate clamp whose schematic cross-sectional diagram is illustrated in FIG. 2, where the structural elements of the conventional substrate clamp are disclosed in the foregoing Description of the Related Art, but in addition to which there is provided a shroud 18a overlapping and spaced from the top member 12a of the substrate clamp. Within the preferred embodiment of the substrate clamp of the present invention, the substrate 10a is preferably a semiconductor substrate.

As illustrated in FIG. 5, within the preferred embodiment of the substrate clamp of the present invention there is exposed a first portion R1 of the substrate 10a when the substrate 10a is clamped between the top member 12a and the backing member 14a of the substrate clamp. In addition, as is also illustrated in FIG. 5, within the preferred embodiment of the substrate clamp of the present invention there is also exposed a second portion R2 of the substrate 10a when the shroud 18a is fixed over the top member 12a of the substrate clamp. As is illustrated in FIG. 5, the shroud 18a overlaps the top member 12a of the substrate clamp, thus, the second portion of the substrate 10a is smaller than and contained within the first portion of the substrate 10a when the substrate 10a is clamped within the substrate clamp. While the preferred embodiment of the substrate clamp of the present invention as illustrated in FIG. 5 may be formed with any of several dimensions to accommodate the dimensions of a substrate to be clamped within the substrate clamp, preferably a shroud elevation clearance "a" as illustrated in FIG. 5 is at least 5 times the thickness of a blanket low melting temperature metal containing conductor layer desired to be formed and thermally processed upon a substrate clamped within the substrate clamp. In the absence of a sufficient shroud elevation clearance "a", the substrate 10a may stick to the shroud 18a when forming a blanket low melting temperature metal containing conductor layer upon the substrate 10a, for reasons independent of the advantages and features provided by the preferred embodiment of the substrate clamp of the present invention. In addition, although not specifically illustrated by the schematic cross-sectional diagram of FIG. 5, a portion of the shroud 18a may contact the substrate 10a provided that there is maintained a shroud elevation clearance "a" at the portion of the shroud 18a over the substrate 10a further removed from the top member 12a.

In addition to the various dimensions which may be employed in forming a substrate clamp in accord with the preferred embodiment of the substrate clamp of the present invention, the substrate clamp of the present invention may also be fabricated from any of several materials. Preferably, the substrate clamp of the present invention is fabricated from materials which are unaffected by the temperature at which a blanket low melting temperature metal containing conductor layer formed upon a substrate clamped within the substrate clamp is thermally processed. Similarly, the shroud 18a of the substrate clamp of the present invention is preferably also fabricated from materials from which there may readily be removed low melting temperature metal containing conductor layer residues formed upon the shroud 18a of the substrate clamp. Materials which fulfill these characteristics include but are not limited to stainless steel, titanium, tantalum and ceramics.

Although not specifically illustrated by the schematic cross-sectional diagram of FIG. 5, the top member 12a of the preferred embodiment of the substrate clamp of the present invention is connected mechanically to the backing member 14a through a first mechanical means as is conventional in the art of substrate clamp design and fabrication, such first mechanical means including but not limited to hinges, cams, lobes and fasteners. Similarly, although also not specifically illustrated by the schematic cross-sectional diagram of FIG. 5, the shroud 18a of the preferred embodiment of the substrate clamp of the present invention is connected mechanically to the backing member through a second mechanical means as is conventional in the art of substrate clamp design and fabrication, such second mechanical means also including but not limited to hinges, cams, lobes and fasteners. Important to the present invention is that the shroud 18 may be removed from the backing member 14a of the preferred embodiment of the substrate clamp of the present invention while the substrate 10a remains clamped between the backing member 14a and the top member 12a of the preferred embodiment of the substrate clamp of the present invention. Preferably, the first mechanical means for connecting the top member 12a with the backing member 14a and the second mechanical means for connecting the shroud 18a with the backing member 14a will include a minimal number of parts which may generate particulate when connecting or disconnecting the top member 12a or the shroud 18a with the backing member 14a.

Referring now to FIG. 6, there is shown a schematic cross-sectional diagram illustrating the results of the next process step in forming and thermally processing upon the substrate 10a clamped with the preferred embodiment of the substrate clamp of the present invention a blanket low melting temperature metal containing conductor layer.

Shown in FIG. 6 is a blanket low melting temperature metal containing conductor layer 16c formed upon the second region of the substrate 10a, while there is also shown formed upon the shroud 18a a low melting temperature metal containing conductor layer residue 16d. For the preferred embodiment of the substrate clamp of the present invention, the blanket low melting temperature metal containing conductor layer 16c and the low melting temperature metal containing conductor layer residue 16d are preferably formed from an aluminum containing conductor material such as but not limited to aluminum, aluminum alloy, aluminum-silicon alloy, aluminum-copper alloy and aluminum-silicon-copper alloy. Preferably the thickness of the blanket low melting temperature metal containing conductor layer 16c and the low melting temperature metal containing conductor layer residue 16d so formed are each from about 250 to about 20000 angstroms. More preferably, the blanket low melting temperature metal containing conductor layer 16c and the low melting temperature metal containing conductor layer residue 16d are formed from an aluminum-silicon-copper alloy of weight ratio from about 100:2:0.1 to about 100:10:5. The blanket low melting temperature metal containing conductor layer 16c and the low melting temperature metal containing conductor layer residue 16d are typically formed simultaneously through blanket low melting temperature metal containing conductor layer deposition methods as are known in the art, including but not limited to thermally assisted evaporation methods, electron beam assisted evaporation methods, and physical vapor deposition (PVD) sputtering methods.

Referring now to FIG. 7, there is shown a schematic cross-sectional diagram illustrating the results of the next process step in forming and thermally processing upon the substrate 10a clamped within the preferred embodiment of the substrate clamp of the present invention a blanket low melting temperature metal containing conductor layer. Shown in FIG. 7 is a schematic cross-sectional diagram of the substrate 10a clamped within the substrate clamp as illustrated within FIG. 6, but from which substrate clamp has been removed the shroud 18a having the low melting temperature metal containing conductor layer residue 16d formed thereupon. Since the preferred embodiment of the substrate clamp of the present invention is designed such that the shroud 18a may be removed from the backing member 14a while the substrate 10a remains clamped between the top member 12a and the backing member 14a, the shroud 18a is removed from the substrate clamp, as illustrated in FIG. 7, while the substrate 10a remains clamped between the backing member 14a and the top member 12a.

Figure 8:
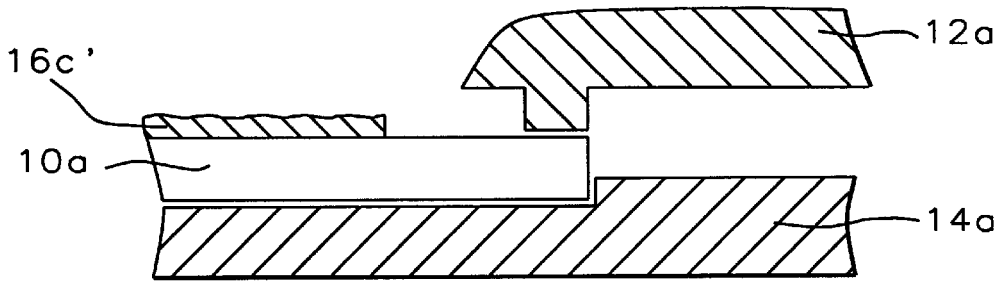

Referring now to FIG. 8, there is shown a schematic cross-sectional diagram illustrating the results of the final process step in forming and thermally processing upon the substrate 10a clamped within the preferred embodiment of the substrate clamp of the present invention a blanket low melting temperature metal containing conductor layer. Shown in FIG. 8 is the results of thermally processing the blanket low melting temperature metal containing conductor layer 16c as illustrated in FIG. 7 to form the thermally processed blanket low melting temperature metal containing conductor layer 16c'. Preferably, the blanket low melting temperature metal containing conductor layer 16c is thermally processed to form the thermally processed blanket low melting temperature metal containing conductor layer 16c' through thermal annealing at a temperature of greater than about 350 degrees centigrade, more preferably at a temperature of from about 400 to about 600 degrees centigrade. As is illustrated by the schematic cross-sectional diagram of FIG. 8, the thermally processed blanket low melting temperature metal containing conductor layer 16c' is formed upon the substrate 10a without sticking of the substrate 10a to the preferred embodiment of the substrate clamp of the present invention. Such sticking is avoided by removing the shroud 18a of the preferred embodiment of the substrate clamp of the present invention having the low melting temperature metal containing conductor layer residue 16d formed thereupon prior to thermally processing the blanket low melting temperature metal containing conductor layer 16c upon the substrate 10a.

As is understood by a person skilled in the art, the preferred embodiment of the substrate clamp of the present invention is illustrative of the substrate clamp of the present invention rather than limiting of the substrate clamp of the present invention. Revisions and modifications may be made to materials, structures and dimensions through which is formed and employed the substrate clamp of the preferred embodiment of the present invention while still providing a substrate clamp and a method employing the substrate clamp in accord with the spirit and scope of the present invention, as defined by the appended claims.

What is claimed is:

1. A clamp for fixturing a substrate when forming and thermally processing upon the substrate a thermally flowable layer comprising:
   a backing member;
   a top member connected through a first mechanical means to the backing member, the backing member and the top member being sized such that a substrate may be clamped between the backing member and the top member, a portion of the top member overlapping the substrate and leaving exposed a first portion of the substrate when the substrate is clamped between the backing member and the top member; and a shroud connected through a second mechanical means to the backing member, a portion of the shroud overlapping the top member, the shroud leaving exposed a second portion of the substrate which is smaller than and contained within the first portion of the substrate, the shroud being removable from the backing member while the substrate remains clamped between the backing member and the top member.

2. The clamp of claim 1 wherein the shroud is employed to avoid sticking of the substrate clamped within the substrate clamp when the shroud is removed from the backing member after forming a thermally flowable layer upon the second portion of the substrate and prior to thermally processing the thermally flowable layer formed upon the second portion of the substrate.

3. The clamp of claim 2 wherein the thermally flowable layer is formed from a thermally flowable material chosen from the group consisting of organic polymer materials, inorganic polymer materials, hybrid polymer materials, glasses and metals.

4. The clamp of claim 2 wherein the substrate is chosen from the group of substrates consisting of semiconductor substrates, ceramic substrates, glass substrates, gallium arsenide substrates, silicon on insulator (SOI) substrates and silicon on sapphire (SOS) substrates.

5. The clamp of claim 1 wherein the shroud is spaced from the top member.

6. A clamp for fixturing a substrate when forming and thermally processing upon the substrate a metal containing conductor layer comprising:

a backing member; and a top member connected through a first mechanical means to the backing member, the backing member and the top member being sized such that a substrate may be clamped between the backing member and the top member, a portion of the top member overlapping the substrate and leaving exposed a first portion of the substrate when the substrate is clamped between the backing member and the top member; and a shroud connected through a second mechanical means to the backing member, a portion of the shroud overlapping the top member, the shroud leaving exposed a second portion of the substrate which is smaller than and contained within the first portion of the substrate, the shroud being removable from the backing member while the substrate remains clamped between the backing member and the top member.

7. The clamp of claim 6 wherein the shroud is employed to avoid sticking of the substrate clamped within the substrate clamp when the shroud is removed from the backing member after forming a metal containing conductor layer upon the second portion of the substrate and prior to thermally processing the metal containing conductor layer formed upon the second portion of the substrate.

8. The clamp of claim 7 wherein the metal containing conductor layer is formed from a metal containing conductor selected from the group consisting of aluminum, aluminum alloys, aluminum-silicon alloys, aluminum-copper alloys, aluminum-silicon-copper alloys, lead, lead alloys, tin, tin alloys, antimony, antimony alloys, indium and indium alloys.

9. The clamp of claim 7 wherein the substrate is chosen from the group of substrates consisting of semiconductor substrates, ceramic substrates, glass substrates, gallium arsenide substrates, silicon on insulator (SOI) substrates and silicon on sapphire (SOS) substrates.

10. The clamp of claim 6 wherein the shroud is spaced from the top member.

* * * * *